US007452752B2

(12) United States Patent
Noda et al.

(10) Patent No.: US 7,452,752 B2
(45) Date of Patent: Nov. 18, 2008

(54) PRODUCTION METHOD OF SEMICONDUCTOR CHIP

(75) Inventors: Kazuki Noda, Sagamihara (JP); Masaru Iwasawa, Sagamihara (JP)

(73) Assignee: 3M Innovative Properties Company, St. Paul, MN (US)

( * ) Notice: Subject to any disclaimer, the term of this patent is extended or adjusted under 35 U.S.C. 154(b) by 36 days.

(21) Appl. No.: 10/595,871

(22) PCT Filed: Oct. 20, 2004

(86) PCT No.: PCT/US2004/034662

§ 371 (c)(1), (2), (4) Date: May 17, 2006

(87) PCT Pub. No.: WO2005/057651

PCT Pub. Date: Jun. 23, 2005

(65) Prior Publication Data

US 2007/0077685 A1      Apr. 5, 2007

(30) Foreign Application Priority Data

Nov. 27, 2003     (JP)     ............................. 2003-397960

(51) Int. Cl.
*H01L 21/44* (2006.01)
*H01L 21/48* (2006.01)
*H01L 21/50* (2006.01)

(52) U.S. Cl. ................ 438/114; 438/464; 257/E21.499

(58) Field of Classification Search ................. 438/455, 438/458, 459, 460, 464, 465, 107, 114; 430/273.1, 430/200; 257/620, 506, E21.499
See application file for complete search history.

(56) References Cited

U.S. PATENT DOCUMENTS

| 4,818,323 | A | * | 4/1989 | d'Aragona et al. | ........... 156/286 |
| 4,848,323 | A | * | 7/1989 | Marijnissen et al. | ........ 600/108 |
| 5,414,297 | A | * | 5/1995 | Morita et al. | ............... 257/620 |
| 5,476,566 | A | | 12/1995 | Cavasin | |
| 6,214,520 | B1 | * | 4/2001 | Wolk et al. | ............... 430/273.1 |

(Continued)

FOREIGN PATENT DOCUMENTS

CN           1255522 A          6/2000

(Continued)

*Primary Examiner*—Walter L Lindsay, Jr.
*Assistant Examiner*—Kenisha V Ford
(74) *Attorney, Agent, or Firm*—Stephen F. Wolf

(57) ABSTRACT

Provided is a method for producing a semiconductor chip, comprising applying a photothermal conversion layer on a light-transmitting support, provided that upon irradiation of radiation energy, the photothermal conversion layer converts the radiation energy into heat and decomposes due to the heat; laminating the semiconductor wafer and the light-transmitting support through a photocurable adhesive by placing the circuit face and the photothermal conversion layer to face each other, thereby forming a laminated body having a non-circuit face on the outside; grinding the non-circuit face of the semiconductor wafer until the semiconductor wafer reaches a desired thickness; dicing the ground semiconductor wafer from the non-circuit face side to cut it into a plurality of semiconductor chips; irradiating radiation energy from the light-transmitting support side to decompose the photothermal conversion layer, thereby causing separation into a semiconductor chips having the adhesive layer and a light-transmitting support; and optionally removing the adhesive layer from the semiconductor chips.

20 Claims, 8 Drawing Sheets

U.S. PATENT DOCUMENTS

| | | |
|---|---|---|
| 6,235,141 B1 | 5/2001 | Feldman et al. |
| 6,284,425 B1 | 9/2001 | Staral et al. |
| 6,358,664 B1 | 3/2002 | Nirmal et al. |
| 6,551,906 B2 * | 4/2003 | Oka .................... 438/465 |
| 6,620,649 B2 * | 9/2003 | Uchida .................... 438/107 |
| 6,792,991 B2 | 9/2004 | Thallner |
| 6,939,741 B2 * | 9/2005 | Fukuoka et al. .......... 438/114 |
| 7,201,969 B2 * | 4/2007 | Miyakawa et al. ........ 428/522 |
| 7,226,812 B2 * | 6/2007 | Lu et al. .................... 438/114 |
| 2001/0018404 A1 | 8/2001 | Oshima et al. |
| 2004/0185639 A1 | 9/2004 | Fukuoka et al. |
| 2004/0259332 A1 | 12/2004 | Fukuoka et al. |

FOREIGN PATENT DOCUMENTS

| | | |
|---|---|---|
| DE | 100 51 938 A1 | 2/2002 |
| EP | 0 571 649 A1 | 12/1993 |
| EP | 0 976 802 A1 | 2/2000 |
| EP | 0 977 254 A2 | 2/2000 |
| EP | 1 167 483 A1 | 1/2002 |
| EP | 1 229 388 A2 | 8/2002 |
| JP | 63-30581 | 2/1988 |
| JP | 05-335411 | 12/1993 |
| JP | 06-132432 | 5/1994 |
| JP | 6-302569 | 10/1994 |
| JP | 7-145357 | 6/1995 |
| JP | 11-026404 | 1/1999 |
| JP | 11-283279 | 10/1999 |
| JP | 2000-038556 | 2/2000 |
| JP | 2000-040677 | 2/2000 |
| JP | 2000-195826 | 7/2000 |
| JP | 2002-353170 | 12/2002 |
| WO | WO 01/35457 A1 | 5/2001 |
| WO | WO 03/017363 A1 | 2/2003 |
| WO | WO 03/060972 A1 | 7/2003 |
| WO | WO 03/085714 A1 | 10/2003 |

* cited by examiner

PRODUCTION METHOD OF SEMICONDUCTOR CHIP

TECHNICAL FIELD

The present invention relates to a production method of a semiconductor chip.

BACKGROUND

In the semiconductor industry, thinning of a semiconductor wafer is proceeding so as to respond to thinning of package or high density packaging by the technique of stacking chips. Thinning is performed by so-called back-surface grinding of grinding a wafer surface in the side opposite the pattern-formed surface (circuit face). Usually, in conventional techniques of performing the back-surface grinding and conveyance while holding the wafer only by a backgrinding protective tape, thinning can be accomplished in practice only to a thickness of about 150 µm because of problems such that the wafer with the protective tape is warped after grinding or the thickness at the grinding is low in the uniformity. In order to solve these problems, polyethylene terephthalate (PET) having high rigidity and large thickness (from 100 to 200 µm) is used as the substrate of the backgrinding protective tape and thereby a semiconductor wafer having a thickness of about 50 µm can be produced.

Meanwhile, the thinned semiconductor wafer is cut into individual chips through a cutting step called dicing process. Particularly, in obtaining chips from a semiconductor wafer thinned to an extremely small thickness of 50 µm or less, a low yield in the dicing process becomes a problem. This is because in a normal method of dicing a semiconductor wafer thinned by back-surface grinding and laminated to a pressure-sensitive adhesive tape called dicing tape, chipping (edge chipping) is generated at the dicing of the semiconductor water in contact with the pressure-sensitive adhesive sheet and the yield greatly decreases.

In order to solve this problem at the dicing of the semiconductor wafer, Japanese Unexamined Patent Publications (Kokai) No. 5-335411, Kokai No. 2000-195826 and Kokai No. 2002-353170 disclose a method where a groove having a depth larger than the final finish thickness is previously provided by half-scribing in scribe lines (lines to be cut later, which are dividing individual semiconductor chips) on the circuit face before the back-surface grinding of the semiconductor wafer and by the subsequent back-surface grinding, the division into chips is performed at the same time with the grinding. In this method, the yield in the dicing process of an ultrathin wafer can be greatly improved. However, the adhesion of a die bonding tape to the ground face after the grinding, which is necessary mainly in the application to stacked IC and the like, is performed after the wafer is divided, therefore, only the die bonding tape must be separately diced and the productivity greatly decreases.

As another method capable of preventing chipping, Kokai No. 6-132432 discloses a method of back-surface grinding a semiconductor wafer laminated on a hard support by using a wax, and then dicing the wafer from the back surface (non-circuit face). In this method, chipping can be prevented according to the kind of wax material, however, the semiconductor wafer after dicing must be dipped in a solvent so as to remove the wax and this decreases the productivity of chip manufacturing.

SUMMARY OF THE INVENTION

Accordingly, an object of the present invention is to provide a method for producing a semiconductor chip, comprising a step of dicing a semiconductor wafer, where chipping at the dicing can be reduced, minimized or even effectively prevented.

In one embodiment of the present invention, a method for producing a semiconductor chip is provided, comprising a step of applying a photothermal conversion layer comprising a light-absorbing agent and a heat decomposable resin on a light-transmitting support, provided that upon irradiation of radiation energy, the photothermal conversion layer converts the radiation energy into heat and breaks down or decomposes due to the heat, a step of preparing a semiconductor wafer having a circuit face with a circuit pattern and a non-circuit face on the side opposite the circuit face, laminating the semiconductor wafer and the light-transmitting support through a photocurable adhesive by placing the circuit face and the photothermal conversion layer to face each other, and irradiating light from the light-transmitting support side to cure the photocurable adhesive layer, thereby forming a laminated body having a non-circuit face on the outside surface, a step of grinding the non-circuit face of the semiconductor wafer until the semiconductor wafer reaches a desired thickness, a step of dicing the ground semiconductor wafer from the non-circuit face side to cut it into a plurality of semiconductor chips, a step of irradiating radiation energy from the light-transmitting support side to decompose the photothermal conversion layer, thereby causing separation into semiconductor chips having the adhesive layer and a light-transmitting supports, and optionally a step of removing the adhesive layer from the semiconductor chips.

In another embodiment of the present invention, a die bonding tape is affixed to the semiconductor wafer before dicing the ground semiconductor wafer.

DETAILED DESCRIPTION

According to the present invention, a semiconductor wafer ground to a very small thickness can be diced into semiconductor chips without causing chipping. Also, the semiconductor chip can be separated from the support without causing any damage.

Furthermore, when a die bonding tape is laminated on the semiconductor wafer before dicing the ground semiconductor wafer, a semiconductor chip with a die bonding adhesive can be easily produced and the process of producing a stacked IC (Multi-chip package (MCP)) or the like is facilitated.

The production method of a semiconductor chip of the present invention comprises a series of steps of performing the back-surface grinding and then dicing of a semiconductor wafer on a light-transmitting support to divide the semiconductor wafer into semiconductor chips. A semiconductor wafer is fixed on a hard light-transmitting support through an adhesive layer, whereby the wafer can be ground to a very small thickness without causing any damage and also can be diced without causing chipping. Furthermore, a photothermal conversion layer is provided between the semiconductor chip and the light-transmitting support. This photothermal conversion layer decomposes under irradiation of radiation energy such as laser light and enables the separation of a semiconductor chip from the support with minimal or no damage. In this way, according to the method of the present invention, an ultrathin semiconductor chip having good quality with few or no chipping defects can be produced.

The production method of a semiconductor chip of the present invention is described in detail below.

Figure 1:
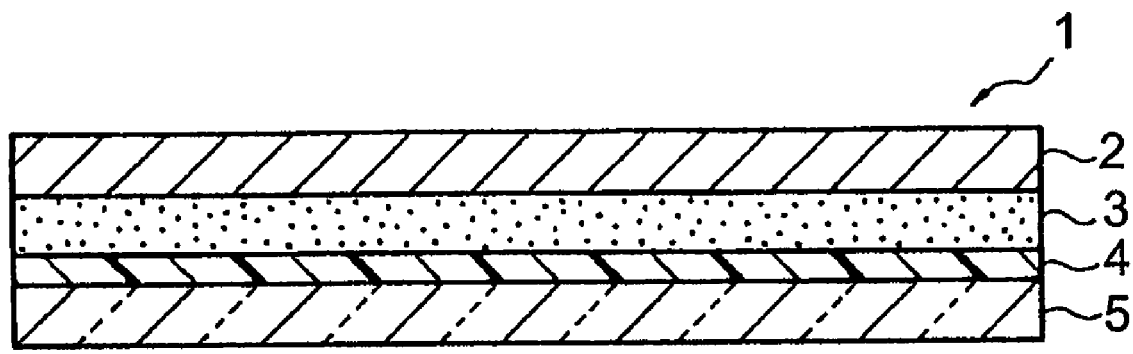
FIG. 1 is a cross-sectional view showing one embodiment of the laminated body formed in the production method of a semiconductor chip of the present invention.

Production of Laminated Body Comprising Semiconductor Wafer/Adhesive Layer/Photothermal Layer/Light-Transmitting Layer Before performing the back-surface grinding, a laminated body comprising a semiconductor wafer/an adhesive layer/a photothermal conversion layer/a support is produced. FIG. 1 shows one example of a laminated body obtained by a laminated body-forming step in the production method of a semiconductor chip of the present invention. In FIG. 1, the laminated body 1 comprises a semiconductor wafer 2, a photocurable adhesive layer 3, a photothermal conversion layer 4 and a light-transmitting support 5 in this order. For the purpose of performing the back-surface grinding later, the circuit face of the semiconductor wafer is contacted with the adhesive layer 3 and the non-circuit face is exposed. In the production of the laminated body, it is important to prevent detrimental foreign substances such as air from entering between layers. If air enters between layers, the thickness uniformity of the laminated body is impaired and the semiconductor wafer cannot be ground to a small thickness. In the case of producing a laminated body, for example, the following method may be considered. First, a precursor coating solution for a photothermal conversion layer is coated on a support by any one method described later, dried and cured, for example, by irradiating an ultraviolet ray. Thereafter, a photocurable adhesive is coated on either one or both of the surface of the cured photothermal conversion layer and the circuit face (surface in the non-grinding side) of the semiconductor wafer. These photothermal conversion layer and semiconductor wafer are laminated through the photocurable adhesive and then, the photocurable adhesive is cured, for example, by irradiating light (e.g., ultraviolet ray) from the support side, whereby a laminated body can be formed. The formation of such a laminated body is preferably performed in a vacuum to prevent air from entering between layers. This can be attained by, for example, using the vacuum adhesion apparatus described in Kokai No. 11-283279. The vacuum adhesion apparatus which can be used for forming a laminated body is described later.

The laminated body is preferably designed such that water used during grinding of the substrate to be ground does not intrude and the adhesion between layers is sufficiently high to cause no dropping off of the substrate and also such that the photothermal conversion layer is resistant against abrasion and not abraded by the water flow (slurry) containing dusts of the ground substrate.

In the following embodiment, laser light is used as the radiation energy and a silicon wafer is used as the semiconductor wafer, however, the present invention is not limited thereto.

Figure 2A:
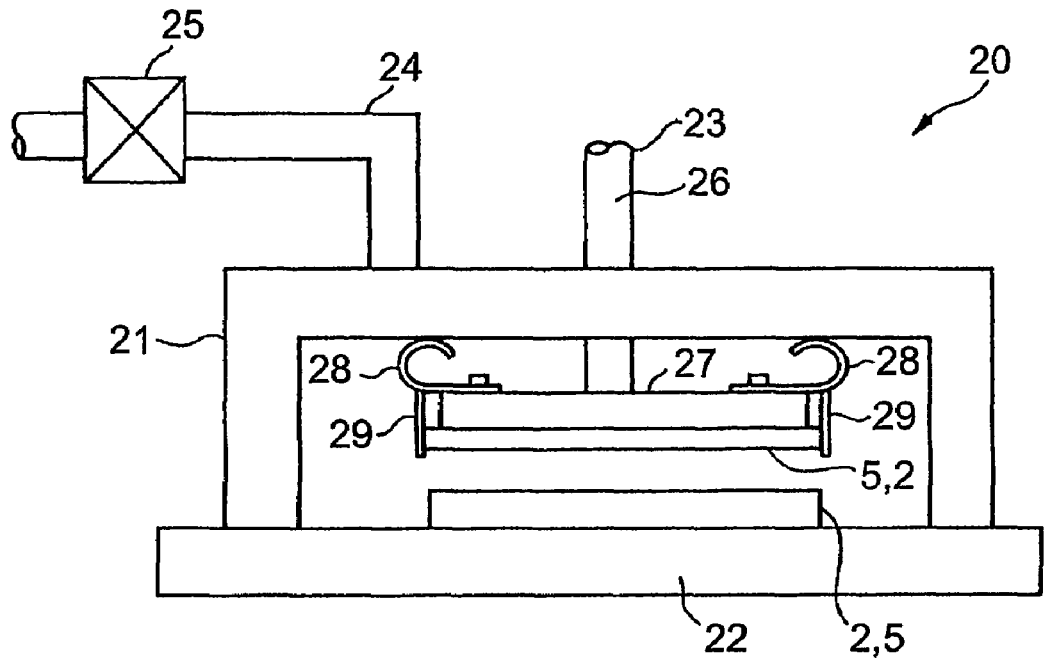
FIGS. 2(a) and 2(b) show a cross-sectional view of a vacuum adhesion apparatus which can be used in the method of the present invention.
Figure 2B:
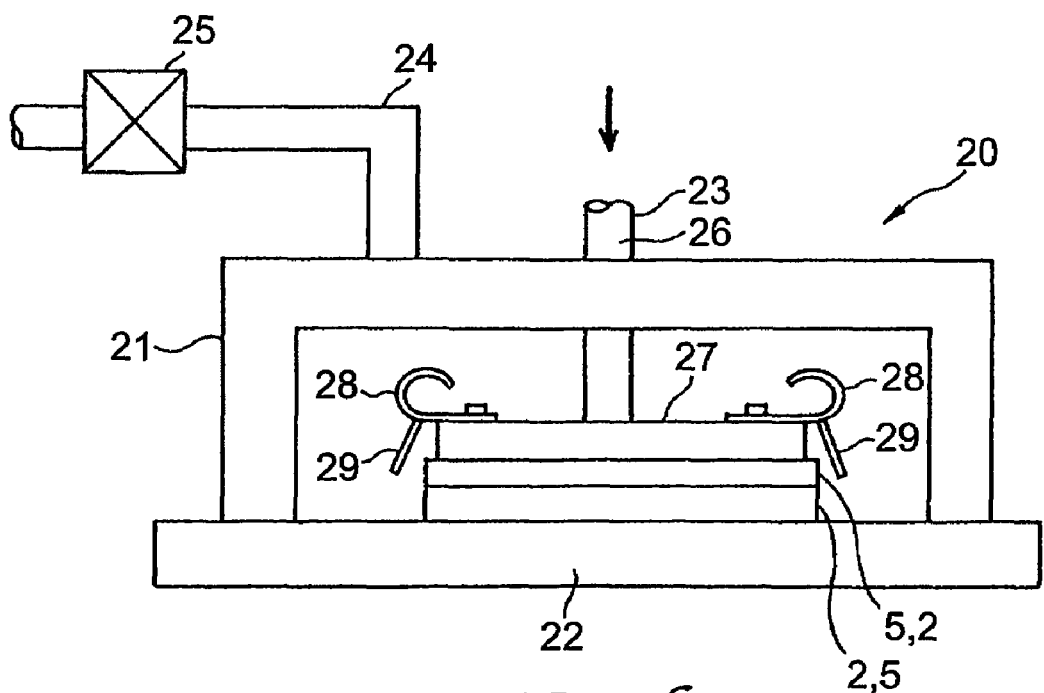

FIG. 2 shows a cross-sectional view of a vacuum adhesion apparatus suitable for the production of the above-described laminated body. A vacuum adhesion apparatus 20 comprises a vacuum chamber 21; a supporting part 22 provided in the vacuum chamber 21, on which either one of a silicon wafer 2 or a support 5 is disposed; and holding/releasing means 23 provided in the vacuum chamber 21 and movable in the vertical direction at the upper portion of the supporting part 22, which holds/releases the other one of the support 5 or the silicon wafer 2. The vacuum chamber 21 is connected to a pressure reducing apparatus (not shown) through a vacuum line 24 and a vacuum valve 25, so that the pressure inside the vacuum chamber 21 can be reduced. The holding/releasing means 23 has a shaft 26 movable up and down in the vertical direction, a contact surface part 27 provided at the distal end of the shaft 26, leaf springs 28 provided in the periphery of the contact surface part 27, and holding claws 29 extending from each leaf spring 28. As shown in FIG. 2(a), when the leaf springs are in contact with the upper surface of the vacuum chamber 21, the leaf springs 28 are compressed and the holding claws 29 are directed toward the vertical direction to hold the support 5 or the wafer 2 at peripheral edges. On the other hand, as shown in FIG. 2(b), when the shaft 26 is pressed down and the support 5 or the wafer 2 is in close proximate to the wafer 2 or the support 5 disposed on the supporting part, the holding claws 29 are released together with the leaf springs 28 to superpose the support 5 and the wafer 2.

Specifically, the laminated body can be produced as follows by using this vacuum adhesion apparatus 20. First, as described above, a photothermal conversion layer is formed on a support to prepare a support 5 having formed thereon a photothermal conversion layer. Separately, a wafer to be laminated is prepared. On either one or both of the photothermal conversion layer of the support 5 and the wafer 2, an adhesive is applied. The thus-prepared support 5 and water 2 are disposed in the vacuum chamber 21 of the vacuum adhesion apparatus 20 as shown in FIG. 2(a), the pressure is reduced by the pressure reducing apparatus, the shaft 26 is pressed down to laminate the wafer and the support as shown in FIG. 2(b) and after opening to air, the photocurable adhesive is cured by irradiating light thereon from the support 5 side to obtain a laminated body.

Figure 3:
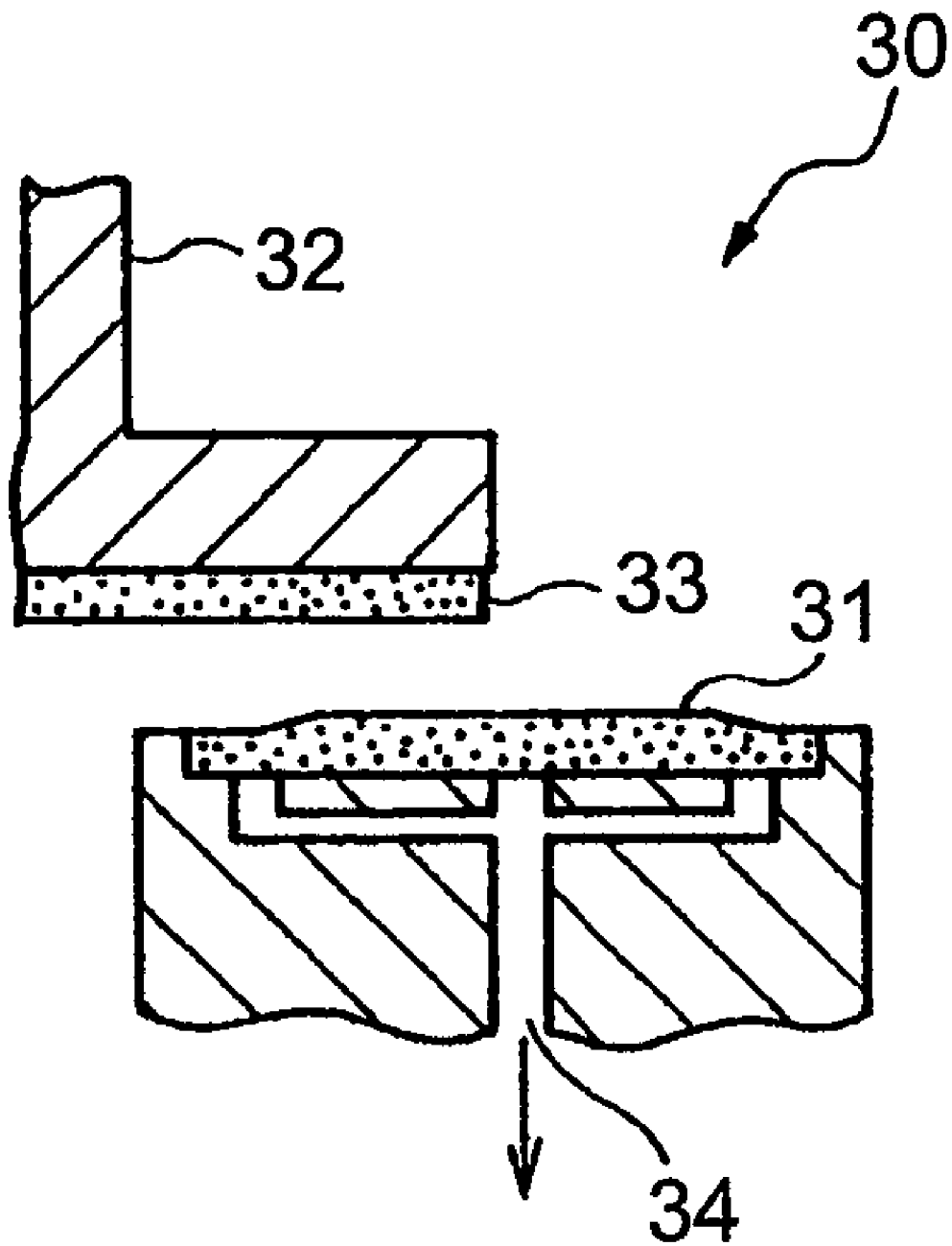
FIG. 3 is a partial cross-sectional view of a grinding apparatus which can be used in the method of the present invention.

FIG. 3 shows a partial cross-sectional view of a grinding apparatus useful with the invention. The grinding apparatus 30 comprises a pedestal 31 and a grinding wheel 33 rotatably mounted on the bottom of a spindle 32. A suction port 34 is provided beneath the pedestal 31 and the suction port 34 is connected to a pressure reducing apparatus (not shown), whereby a material to be ground is suctioned and fixed on the pedestal 31 of the grinding apparatus 30. A laminated body 1 of the present invention shown in FIG. 1 is prepared and used as the material to be ground. The support side of the laminated body 1 is placed on the pedestal 31 of the grinding apparatus 30 and fixed by suction using a pressure reducing apparatus. Thereafter, while feeding a water flow, the grinding wheel 33 under rotation is brought into contact with the laminated body 1, thereby performing the grinding. The grinding can be performed to an ultrathin level of 150 μm or less. In other embodiments, grinding can be performed to an ultrathin level of 50 μm or less, more preferably 25 μm or less.

Figure 4A:
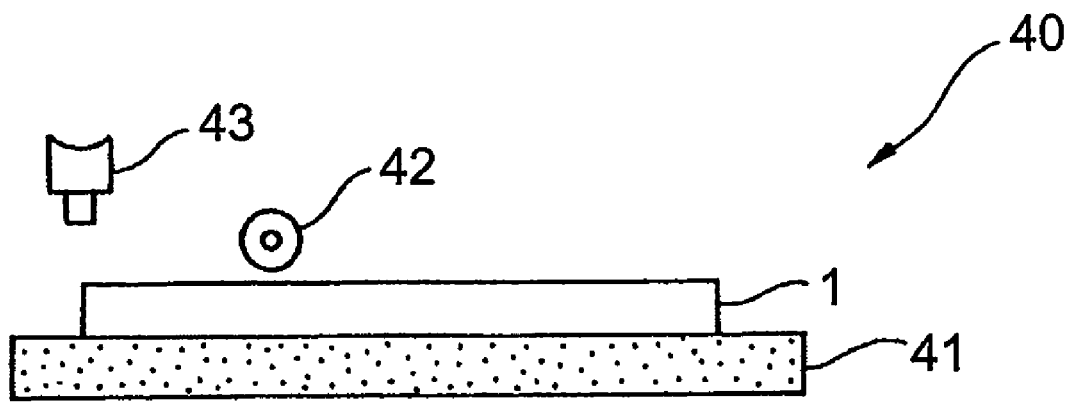
FIGS. 4(a) and 4(b) show a cross-sectional view of a dicing apparatus which can be used in the method of the present invention.
Figure 4B:
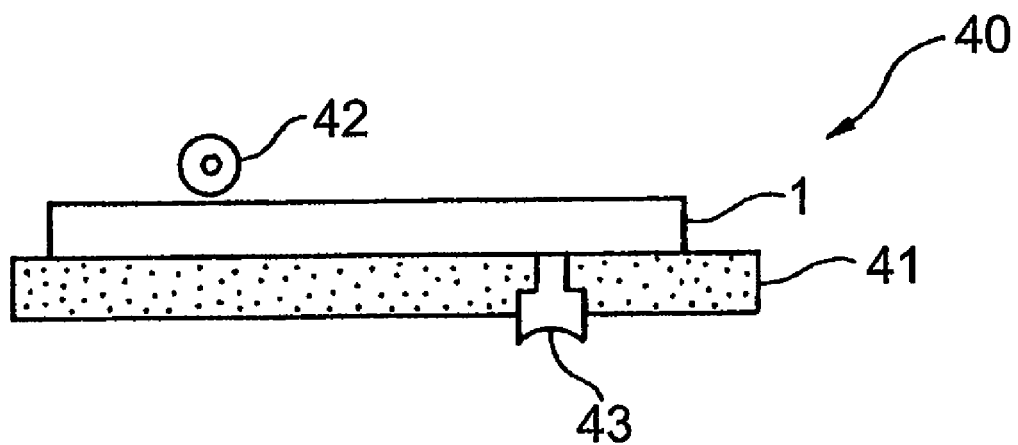
Figure 5A:
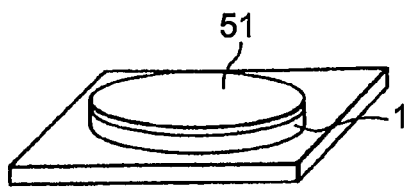
FIGS. 5(a) and 5(a') through 5(e) show a view showing the process of separating the support and peeling the adhesive layer.
Figure 5A:
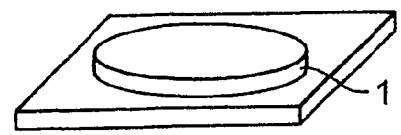
Figure 5B:
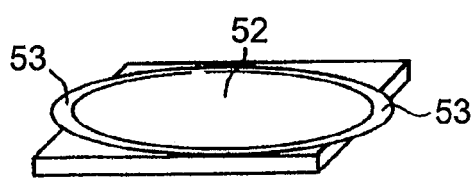
Figure 5C:
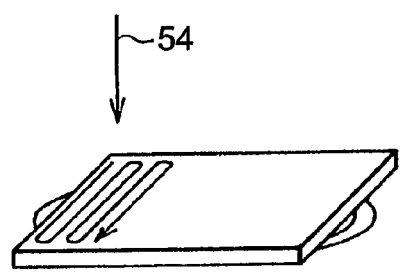
Figure 5D:
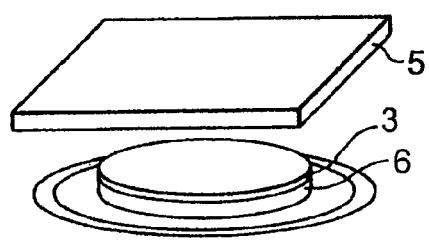
Figure 5E:
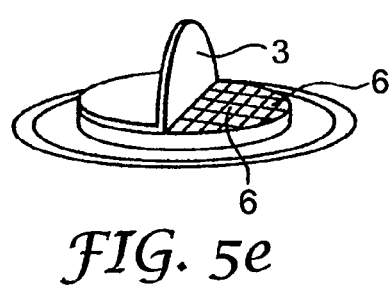

After grinding the semiconductor wafer to a desired level, the ground semiconductor wafer is diced and thereby cut into a plurality of semiconductor chips. The circuit face of the semiconductor wafer 2 of the laminated body 1 after grinding is on the adhesive layer 3 side and therefore, the scribe lines (lines to be cut) on the circuit face cannot be directly observed from the outside. Therefore, the dicing apparatus needs to have a function of observing the circuit face in the inner side. FIG. 4 shows a schematic view of a dicing apparatus which can be used in the present invention. The laminated body 1 is fixed on a chuck table 41 by a pressure reducing mechanism such as in the above-described grinding apparatus. Here, FIG. 4(*a*) shows an apparatus having an image recognizing unit 43 comprising a light source and a charge coupled device (CCD) above the laminated body, and FIG. 4(*b*) shows an apparatus having an image recognizing unit 43 comprising a light source and a charge coupled device (CCD) below the laminated body. The apparatus of FIG. 4(*a*) requires use of a light source irradiating light capable of passing through the semiconductor layer, such as ultraviolet ray, and also use of CCD sensitive to such light. On the other hand, the apparatus of FIG. 4(*b*) requires use of light capable of passing through the light-transmitting support and photothermal conversion layer, such as visible light or ultraviolet ray, and also use of CCD sensitive to such light. The light irradiated from the light source is reflected on the circuit face of the semiconductor wafer and the light is converted into electrical signals by CCD, whereby the scribe lines on the circuit face can be recognized as an image. Based on the thus-recognized scribe lines, the semiconductor wafer is diced by a dicing blade 42. The dicing is preferably performed after affixing a die bonding tape to the ground semiconductor wafer, because a semiconductor chip with a die bonding tape can be formed. However, the dye bonding tape generally inhibits the transmission of infrared ray. Furthermore, the optical properties of silicon wafer are affected by impurities and as the amount of impurities doped increases, the infrared transmittance sometimes decreases. In such a case, an apparatus of the type shown in FIG. 4(*b*) is used.

After the dicing, the laminated body 1 is removed and conveyed to the next steps where separation of the chip and the support by laser light and peeling of the adhesive layer from the chip are performed. FIG. 5 is a view showing the steps of separating the support and peeling the adhesive layer. As described in the dicing step above, depending on the case, a die bonding tape 51 is disposed in the chip side of the laminated body 1 (FIG. 5(*a*)) or a die bonding tape 51 is not disposed (FIG. 5(*a*')). On the chip side of the laminated body 1 having a plurality of chips, a pressure-sensitive adhesive tape 52 is disposed. The pressure-sensitive adhesive tape 52 is usually fixed within the plane by a ring-like metal frame 53 (FIG. 5(*b*)). Subsequently, laser light 54 is irradiated from the support side of the laminated body 1 (FIG. 5(*c*)). After the irradiation of laser light, the support 5 is picked up to separate the support 5 from the chip 6 (FIG. 5(*d*)). Finally, the adhesive layer 3 is separated by peeling to obtain a thinned chip 6 (FIG. 5(*e*)). Here, the pressure-sensitive adhesive tape 52 should have an adhesive strength high enough to fix individual chips 6 at the removal of the adhesive layer 3 but low enough to facilitate its peeling after the removal of the adhesive layer 3.

Figure 6:
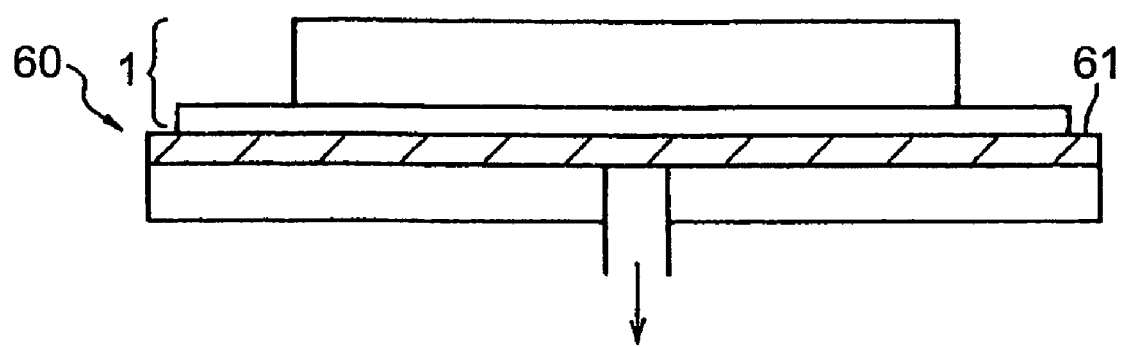
FIG. 6 is a cross-sectional view of a laminated body-fixing apparatus which can be used in the laser irradiation process.
Figure 7A:
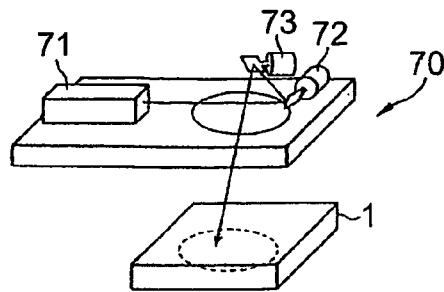
FIGS. 7(a) through 7(f) shows a perspective view of a laser irradiation apparatus.
Figure 7B:
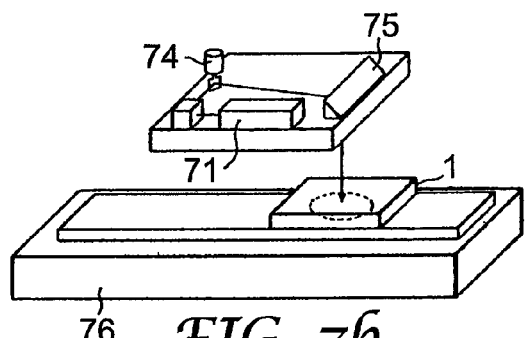
Figure 7C:
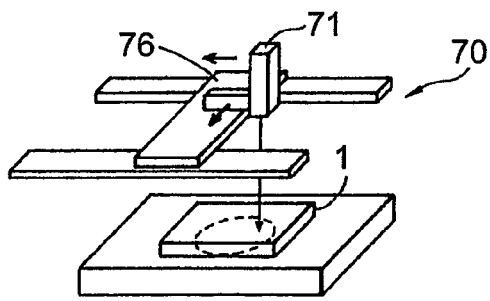
Figure 7D:
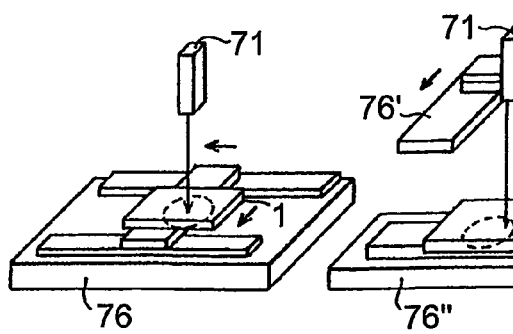
Figure 7E:
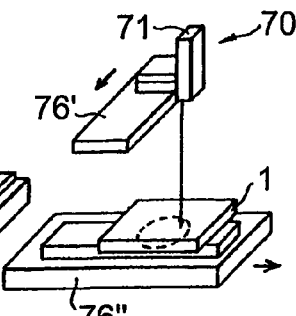
Figure 7F:
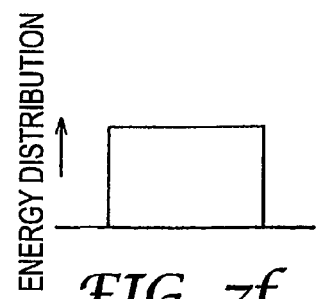

FIG. 6 shows a cross-sectional view of a laminated body-fixing apparatus which can be used, for example, in the step of irradiating laser light. The laminated body 1 is mounted on a fixing plate 61 such that the support comes to the upper surface with respect to the fixing apparatus 60. The fixing plate 61 is made of a porous metal such as sintered metal or a metal having surface roughness. The fixing plate 61 is depressurized from beneath by a vacuum apparatus (not shown) and thereby the laminated body 1 is fixed by suction onto the fixing plate 61. The vacuum suction force is preferably strong enough not to cause dropping of the chip in the subsequent steps of separating the support and peeling the adhesive layer. On the laminated body thus fixed, laser light is irradiated. For the irradiation of laser light, a laser light source having an output high enough to cause decomposition of the heat decomposable resin in the photothermal conversion layer at the wavelength of light absorbed by the photothermal conversion layer is selected so that a decomposition gas can be generated and the support and the wafer can be separated. For example, a YAG laser (wavelength: 1,064 nm), a second harmonic generation YAG laser (wavelength: 532 nm) and a semiconductor laser (wavelength: from 780 to 1,300 nm) can be used.

As the laser irradiation apparatus, an apparatus capable of scanning a laser beam and setting the laser output and beam moving speed to form a desired pattern on the irradiated surface is selected. Also, in order to stabilize the processing quality of the irradiated material (laminated body), an apparatus having a large focus depth is selected. The focus depth varies depending on the dimensional precision in the apparatus design and is not particularly limited but the focus depth is preferably 30 μm or more. FIG. 7 shows a perspective view of a laser irradiation apparatus which can be used in the present invention. The laser irradiation apparatus 70 of FIG. 7(*a*) is equipped with a galvanometer having a biaxial configuration composed of X axis and Y axis and is designed such that the laser light oscillated from a laser oscillator 71 is reflected by the Y axis galvanometer 72, further reflected by the X axis galvanometer 73 and irradiated on the laminated body 1 on the fixing plate. The irradiation position is determined by the directions of galvanometers 72 and 73. The laser irradiation apparatus 70 of FIG. 7(*b*) is equipped with a uniaxial galvanometer or a polygon mirror 74 and a stage 76 movable in the direction orthogonal to the scanning direction. The laser light from the laser oscillator 71 is reflected by the gatvanometer or polygon 74, further reflected by a hold mirror 75 and irradiated on the laminated body 1 on the movable stage 76. The irradiation position is determined by the direction of galvanometer or polygon 74 and the position of movable stage 76. In the apparatus of FIG. 7(*c*), a laser oscillator 71 is mounted on a movable stage 76 which moves in the biaxial direction of X and Y, and a laser is irradiated on the entire surface of the laminated body 1. The apparatus of FIG. 7(*d*) comprises a fixed laser oscillator 71 and a movable stage 76 which moves in the biaxial direction of X and Y. The apparatus of FIG. 7(*e*) has a constitution such that a laser oscillator 71 is mounted on a movable stage 76' which can move in the uniaxial direction and a laminated body 1 is mounted on a movable stage 76" which can move in the direction orthogonal to the movable stage 76'.

In the case of having a fear of damaging the chip of the laminated body 1 by the laser irradiation, a top hat shape (see, FIG. 7(*f*)) having a steep energy distribution and causing little leakage energy to the adjacent region is preferably formed to suppress the damage in the adjacent region. The beam shape may be changed like this by (a) a method of deflecting the beam by an acousto-optic device, a method of shaping a beam by using refraction/diffraction, or (b) a method of cutting the broadened portion at both edges by using an aperture or a slit.

The laser irradiation energy is determined by the laser power, the beam scanning speed and the beam diameter. For example, the laser power that can be used is, but not limited to, from 0.3 to 100 watts (W), the scanning speed typically is from 0.1 to 40 meters/second (m/s), and the beam diameter typically is from 5 to 300 μm or more. The speed of this step can be increased by elevating the laser power and thereby increasing the scanning speed. Also, since the number of scanning operations can be more reduced as the beam diameter is larger, it may be considered to increase the beam diameter when the laser power is sufficiently high.

The heat decomposable resin in the photothermal conversion layer is decomposed by the laser irradiation to generate a gas, as a result, cracks are generated inside the layer and the photothermal conversion layer itself is separated. When air enters in between cracks, re-adhesion of the cracks can be prevented. Therefore, in order to facilitate the intrusion of air, the scanning of beam is preferably performed from the edge part of the laminated body and throughout the laminated body.

As described above, the glass transition temperature (Tg) of the photothermal conversion layer is preferably room temperature (20° C.) or more. If the Tg is excessively low, the separated cracks may re-adhere with each other during the cooling of decomposed resin and the photothermal conversion layer cannot be separated. The re-adhesion is considered to occur because cracks of the photothermal conversion layer are attached to each other due to own weight of the support. Therefore, the re-adhesion can be prevented when contrived not to impose the own weight of support, for example, by performing the laser irradiation in the vertical direction from the lower part to the upper part (namely, by performing the laser irradiation with a configuration such that the support comes to the bottom side).

In order to irradiate the laser light from the edge part of the laminated body, a method of irradiating the laser light while linearly reciprocating it from the edge part toward the tangential direction of wafer (a plurality of chips after dicing), and a method of spirally irradiating the laser light from the edge part to the center like a phonograph record may be used.

Figure 8A:
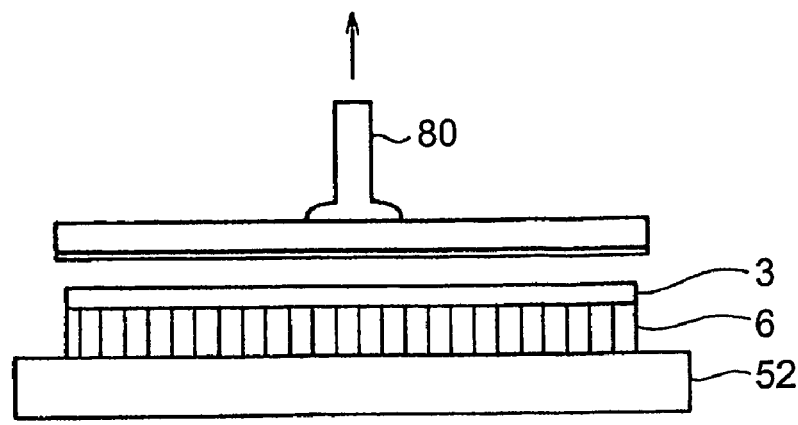
FIGS. 8(a) and 8(b) show a schematic view of a pick-up for use in the operation of separating the chips and the support.
Figure 8B:
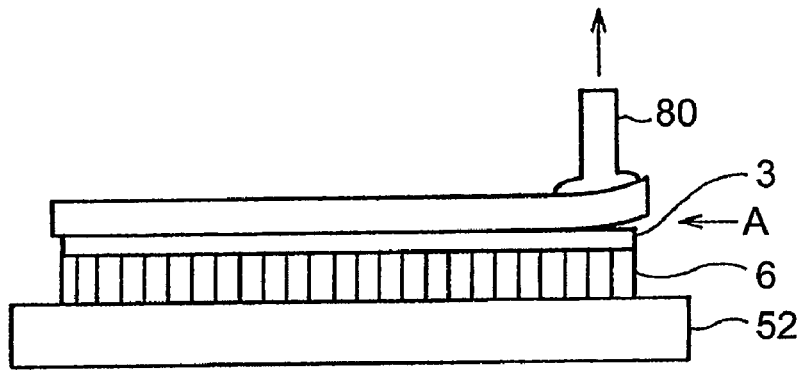

After the laser irradiation, the support is separated from a group of chips produced by the dicing of wafer and for this operation, a general pick-up utilizing a vacuum is used. The pick-up is a cylindrical member connected to a vacuum apparatus, where a suction cup is fixed to the distal end. FIG. 8 shows a schematic view of a pick-up for use in the operation of separating the support from chips. In the case of FIG. 8(*a*), the pick-up 80 is fixed in the center of the support 5 and picked up in the vertical direction, thereby peeling the support. Alternatively, as shown in FIG. 8(*b*), the pick-up 80 is fixed to the edge part of the support 5 and the support is peeled while blowing a compressed air (A) from the lateral side to enter air between the chips 6 and the support 5, whereby the support can be more easily peeled off.

Figure 9:
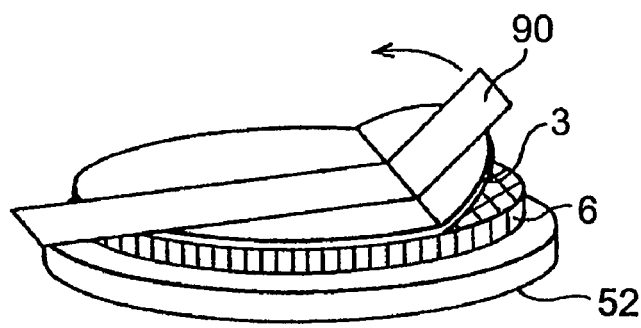
FIG. 9 is a schematic view showing the state of peeling the adhesive layer from the chips.

After the separation of support, the adhesive layer on the chips is removed. FIG. 9 is a schematic view showing the state when the adhesive layer is peeled off. For the removal of adhesive layer 3, a pressure-sensitive adhesive tape 90 for removing the adhesive, which can create stronger adhesion to the adhesive layer 3 than the adhesion between the chips 6 and the adhesive layer 3, can be preferably used. Such a pressure-sensitive adhesive tape 90 is laid to adhere onto the adhesive layer 3 and then peeled in the arrow direction, whereby the adhesive layer 3 is removed. In this way, a plurality of chips 6 in the attached state to the pressure-sensitive adhesive sheet 52 can be obtained.

Thereafter, individuated chips 6 are picked up one by one from the pressure-sensitive adhesive tape 52 and then subjected to a die bonding step of joining it on a lead frame or interposer according to the form of package or in the case of a multilayer type, on another chip. In the case of a chip not laminated with a die bonding tape, a resin or adhesive film is used here as the joining agent.

By further passing through a wire bonding step of connecting the chip terminal and the inner lead of the lead frame, a sealing step (molding step) of molding it with a resin to prevent damage by external force or mingling of impurities, a lead surface treatment step of applying solder plating or dipping to the lead surface, and a cutting-shaping step of individually cutting out packages, the assembling process is completed.

The elements for use in the production of the semiconductor chip of the present invention are described below.

Semiconductor Wafer

The semiconductor wafer is thinned to cope with thinning of package or high density packaging by the technique of stacking chips and this thinning is performed by the back-surface grinding on the surface opposite the pattern-formed wafer surface (circuit face). Examples of the semiconductor wafer formed into chips include silicon and gallium arsenide (GaAs).

Light-Transmitting Support

The light-transmitting support must be a material capable of transmitting radiation energy such as laser light used in the present invention, or light for curing the photocurable adhesive (for example, ultraviolet ray), maintaining the semiconductor wafer in a flat state and undergoing no damage during grinding or conveyance. The light transmittance of the support is sufficient if the radiation energy can be transmitted to the photothermal conversion layer to decompose the photothermal conversion layer by the radiation energy of practical intensity and at the same time, the light for curing the adhesive can be transmitted. However, the transmittance is preferably, for example, 50% or more. Also, the light-transmitting support preferably has a stiffness sufficiently high to prevent the semiconductor wafer from warping at the grinding and the flexural rigidity of the support is preferably $2 \times 10^{-3}$ (Pa m$^3$) or more, more preferably $3 \times 10^{-2}$ (Pa m$^3$) or more. Examples of useful supports include a glass plate and an acrylic plate. Furthermore, in order to enhance the adhesion to an adjacent layer such as photothermal conversion layer, the support may be surface-treated with a silane coupling agent or the like, if desired.

The support is sometimes exposed to heat generated in the photothermal conversion layer at the irradiation of radiation energy or to a high temperature due to frictional heating at the grinding. Also, for the purpose of forming a metal film, a processing such as dry plating (vapor deposition sputtering), wet plating (electroless or electrolytic), plating or etching is sometimes added before separating the semiconductor chip from the support. Particularly, in the case of a silicon wafer, the support is sometimes subjected to a high-temperature processing to form an oxide film. According to these processing conditions, a support having heat resistance, chemical resistance and low expansion coefficient is selected. Examples of the support having these properties include glasses such as synthetic glass, borosilicate glass and sapphire glass, for example, Pyrex, Corning #1737 and #7059 (Corning Inc.) and Tenpax (SCHOTT GLAS).

After the back-surface grinding and before dicing, an intermediate step of etching the semiconductor surface with a chemical solution is sometimes provided. This step is performed to remove the crushed layer (damage layer) on the back surface of semiconductor wafer, which is generated by the grinding, and enhance the bending strength of wafer. In some cases, tens of μm is removed by etching as the final stage in the process of thinning the semiconductor wafer. In the case where the semiconductor wafer is a silicon single crystal, a mixed acid containing hydrogen fluoride is generally used as the etching chemical solution, however, in the case of a glass support (excluding sapphire glass), the edge part of support is also etched by the chemical solution. This phenomenon becomes a problem in the reuse of support but the glass can be protected from the erosion with hydrogen fluoride by previously providing an acid-resistant (resistant against etching chemical solution) protective coat on the glass substrate. As the protective film, an acid-resistant resin can be used and those which can be dissolved in a specific solvent, coated in a solution form, dried and thereby fixed on the glass substrate are preferred. Also, the protective film needs to transmit a sufficient amount of laser light irradiated for separating the glass support from the semiconductor wafer. In this viewpoint, for example, an amorphous polyolefin containing no condensing bond within the molecule, a cyclic olefin copolymer and a polyvinyl chloride can be used as the protective film.

In order to obtain uniformity in the thickness of the semiconductor wafer after grinding, the thickness of the support is preferably uniform. For example, for thinning a silicon wafer to 50 μm or less and attaining uniformity of ±10% or better, the dispersion in the thickness of the support must be reduced to ±2 μm or less. In the case of repeatedly using the support, the support preferably has also scratch resistance. For repeatedly using the support, the wavelength of radiation energy and the support must be selected to suppress the damage on the support by the radiation energy. For example, when a Pyrex glass is used as the support and a third harmonic generation YAG laser (355 nm) is irradiated, the support and the semiconductor chip after dicing of the wafer can be separated, however, such a support exhibits low transmittance at this laser wavelength and absorbs the radiation energy, as a result, the support is thermally damaged and cannot be reused in some cases.

Photothermal Conversion Layer

On the light-transmitting support, a photothermal conversion layer is provided. The photothermal conversion layer contains a light-absorbing agent and a heat decomposable resin. The radiation energy irradiated on the photothermal conversion layer in the form of laser light or the like is absorbed by the light-absorbing agent and converted into heat energy. The heat energy generated abruptly elevates the temperature of the photothermal conversion layer and the temperature reaches the thermal decomposition temperature of the heat decomposable resin (organic component) in the photothermal conversion layer to cause heat decomposition of the resin. The gas generated by the heat decomposition forms a void layer (air space) in the photothermal conversion layer and divides the photothermal conversion layer into two parts, whereby the support and the semiconductor chip are separated.

The light-absorbing agent absorbs radiation energy at the wavelength used. The radiation energy is usually laser light at a wavelengths of 300 to 2,000 nm, preferably 300 to 1,100 nm, and specific examples thereof include a YAG laser which emits light at a wavelength of 1,064 nm, a second harmonic generation YAG laser at a wavelength of 532 nm, and a semiconductor laser at a wavelength of 780 to 1,300 nm. The light-absorbing agent varies depending on the wavelength of laser light but examples of the light-absorbing agent which can be used include carbon black, graphite powder, microparticle metal powders such as iron, aluminum, copper, nickel, cobalt, manganese, chromium, zinc and tellurium, metal oxide powders such as black titanium oxide, and dyes and pigments such as aromatic diamino-based metal complex, aliphatic diamine-based metal complex, aromatic dithiol-based metal complex, mercaptophenol-based metal complex, squarylium-based compound, cyanine-based dye, methine-based dye, naphthoquinone-based dye and anthraquinone-based dye. The light-absorbing agent may be in the form of a film including a vapor deposited metal film. Among these light-absorbing agents, carbon black is particularly useful, because the carbon black significantly decreases the peeling force, namely, force necessary for separating the semiconductor chip from the support after the irradiation of radiation energy, and accelerates the separation. Furthermore, when a dye (a dye of selectively absorbing light at the wavelength of laser light and transmitting light in other wavelength regions) and carbon black are used in combination as the light absorber, this is particularly useful for the formation of a photothermal conversion layer capable of selectively transmitting light used for the alignment in the dicing step.

The concentration of the light-absorbing agent in the photothermal conversion layer varies depending on the kind, particle state (structure) and dispersion degree of the light-absorbing agent but the concentration is usually from 5 to 70 vol % in the case of general carbon black having a particle size of approximately from 5 to 500 nm. If the concentration is less than 5 vol %, heat generation of the photothermal conversion layer may be insufficient for the decomposition of the heat decomposable resin, whereas if it exceeds 70 vol %, the photothermal conversion layer becomes poor in the film-forming property and may readily cause failure of adhesion to adjacent layers. Also, if the amount of carbon black is excessively large, the transmittance of curing light such as ultraviolet ray for the curing of photocurable (for example, UV-curable) adhesive used for fixing the semiconductor wafer and the light-transmitting support decreases. Therefore, the amount of carbon black should be preferably 60 vol % or less. In order to reduce the force at the removal of support after the irradiation of radiation energy and prevent the abrasion of the photothermal conversion layer during grinding, carbon black is preferably contained in the photothermal conversion layer in an amount of 20 to 60 vol %, more preferably from 35 to 55 vol %.

Examples of the heat decomposable resin which can be used include gelatin, cellulose, cellulose ester (e.g., cellulose acetate, nitrocellulose), polyphenol, polyvinyl butyral, polyvinyl acetal, polycarbonate, polyurethane, polyester, polyorthoester, polyacetal, polyvinyl alcohol, polyvinylpyrrolidone, a copolymer of vinylidene chloride and acrylonitrile, poly(meth)acrylate, polyvinyl chloride, silicone resin and a block copolymer containing a polyurethane unit. These resins can be used individually or in combination of two or more thereof. The glass transition temperature (Tg) of the resin is preferably room temperature (20° C.) or more so as to prevent the re-adhesion of the photothermal conversion layer separated by the formation of a void layer resulting from thermal decomposition of the heat decomposable resin. For preventing the re-adhesion, the Tg is more preferably 100° C. or more. In the case where the light-transmitting support is glass, a heat decomposable resin having within the molecule a polar group (e.g., —COOH, —OH) capable of hydrogen-bonding to the silanol group on the glass surface can be used so as to increase the adhesion between the glass and the photothermal conversion layer. Furthermore, in the application to usage requiring a chemical solution treatment such as chemical etching, a heat decomposable resin having within the molecule a functional group capable of self-crosslinking upon heat treatment, a heat decomposable resin capable of crosslinking by ultraviolet ray or visible light, or a precursor thereof (e.g., monomer-oligomer mixture) may be used so as to impart chemical resistance to the photothermal conversion layer.

Transparent Filler

The photothermal conversion layer may contain a transparent filler, if desired. The transparent filler acts to prevent the re-adhesion of the photothermal conversion layer separated by the formation of a void layer resulting from the thermal decomposition of the heat decomposable resin. Therefore, the force for the separation of the semiconductor chip and the support after the grinding and dicing of semiconductor wafer and the subsequent irradiation with radiation energy can be more reduced. Furthermore, since the re-adhesion can be prevented, the latitude in the selection of the heat decomposable resin is broadened. Examples of the transparent filler include silica, talc and barium sulfate. When a particulate light-absorbing agent such as carbon black is used, the light-absorbing agent has a function of reducing the force for separation but also has a function of disturbing the transmission of visible light or ultraviolet ray. Therefore, curing of a photocurable (for example, UV-curable) adhesive may not proceed satisfactorily or may require a very long time. In such a case, a transparent filler is used, whereby the chip and the support can be separated easily after the irradiation without disturbing the curing of the photocurable adhesive. The amount of the transparent filler can be determined, when a particulate light-absorbing agent such as carbon black is used, by the total amount with the light-absorbing agent. The total amount of the particulate light-absorbing agent (e.g., carbon black) and transparent filler in the photothermal conversion layer is preferably from 5 to 70 vol % based on the volume of the photothermal conversion layer. With the total amount in this range, the force for the separation of the chip and the support can be sufficiently reduced. However, the force for the separation is also affected by the particle state of the particulate light-absorbing agent and the transparent filler. More specifically, the force for the separation is sometimes more effectively reduced with a small amount in the case where the particle state is a complicated particle state (a particle state resulting from development of structure) than in the case where the particle state is nearly spherical. Therefore, the total amount of the particulate light-absorbing agent and the transparent filler is prescribed based on the "critical filler volume concentration" in some cases. The term "critical filler volume concentration" (CFVC) means a filler volume concentration when a mixture of the particulate light-absorbing agent and the transparent filler is left standing in a dry state and the heat decomposable resin is mixed with the filler in an amount of just filling the volume of voids. That is, the filler volume concentration, when the heat decomposable resin is mixed with the filler in an amount of just filling the volume of voids in the mixture of the particulate light-absorbing agent and the transparent filler is defined as 100% of the CFVC. The total amount of the particulate light-absorbing agent and the transparent filler in the photothermal conversion layer is preferably 80% or more, more preferably 90% or more, of the CFVC. With the total amount in this range, the chip and the support are easily separated after the energy irradiation.

The photothermal conversion layer may contain other additives, if desired. For example, in the case of forming the layer by coating a heat decomposable resin in the form of a monomer or an oligomer and thereafter polymerizing or curing the resin, the layer may contain a photo-polymerization initiator. Also, the addition (integral blend method) of a coupling agent for increasing the adhesion between the glass and the photothermal conversion layer and the addition of a crosslinking agent for improving the chemical resistance are effective for respective purposes. Furthermore, in order to promote the separation by the decomposition of the photothermal conversion layer, a low-temperature gas generator may be contained. Representative examples of the low-temperature gas generator which can be used include a foaming agent and a sublimating agent. Examples of the foaming agent include sodium hydrogencarbonate, ammonium carbonate, ammonium hydrogencarbonate, zinc carbonate, azodicarbonamide, azobisisobutylonitrile, N,N'-dinitroso-pentamethylene-tetramine, p-toluenesulfonylhydrazine and p,p-oxybis(benzenesulfonylhydrazide). Examples of the sublimating agent include 2-diazo-5,5-dimethylcyclohexane-1, 3-dione, camphor, naphthalene, borneal, butyramide, valeramide, 4-tert-butylphenol, furan-2-carboxylic acid, succinic anhydride, 1-adamantanol and 2-adamantanone.

The photothermal conversion layer can be formed by mixing the light-absorbing agent such as carbon black, the heat decomposable resin and a solvent to prepare a precursor coating solution, coating this coating solution on the support, and drying it. Also, the photothermal conversion layer can be formed by mixing the light-absorbing agent, a monomer or an oligomer as a raw material for the heat decomposable resin, optionally additives such as photo-polymerization initiator, and a solvent, if desired, to prepare a precursor coating solution in place of the heat decomposable resin solution, coating the obtained coating solution on the support, and drying and thereby polymerizing/curing it. For the coating, a general coating method suitable for the coating on a hard support, such as spin coating, die coating and roll coating, can be used.

In general, the thickness of the photothermal conversion layer is not limited as long as the support and the chip can be separated, but the thickness is usually 0.1 µm or more. If the thickness is less than 0.1 µm, the concentration of the light-absorbing agent required for sufficient light absorption becomes high and this deteriorates the film-forming property, as a result, adhesion to adjacent layers may fail. On the other hand, if the photothermal conversion layer is formed to a thickness of 5 µm or more while keeping constant the concentration of the light-absorbing agent required to enable the separation by the thermal decomposition of the photothermal conversion layer, the photothermal conversion layer (or a precursor thereof) decreases in the light transmittance, as a result, curing of a photocurable, for example, ultraviolet (UV)-curable photothermal conversion layer or adhesive layer is sometimes inhibited to fail in obtaining a sufficiently cured product. Therefore, in the case of, for example, an ultraviolet-curable photothermal conversion layer, in order to minimize the force required to separate the chip from the support after the irradiation of radiation energy and to prevent the abrasion of the photothermal conversion layer during grinding, the thickness of the photothermal conversion layer is preferably from 0.3 to 3 µm, more preferably from 0.5 to 2.0 µm.

Photocurable Adhesive

The photocurable adhesive is used for fixing the semiconductor wafer to the support through a photothermal conversion layer. After the separation of the chip (formed by the dicing of wafer) and the support by the decomposition of the photothermal conversion layer, a chip attached with the photocurable adhesive is obtained. Therefore, the adhesive layer must be easily separated from the substrate by peeling. In this meaning, the adhesive has an adhesive strength high enough to fix the wafer to the support but has an adhesive strength low enough to be separated by peeling. As the adhesive which can be used in the present invention, a UV-curable adhesive obtained by adding a photo-polymerization initiator and, if desired, additives to (1) an oligomer having a polymerizable vinyl group, such as urethane acrylate, epoxy acrylate and polyester acrylate, and/or (2) an acrylic or methacrylic monomer is suitably used. Examples of the additives include a thickening agent, a plasticizer, a dispersant, a filler, a fire retardant and an anti-heat aging agent.

In particular, for filling the adhesive layer in the asperities of the circuit pattern on the silicon wafer and rendering the thickness uniform, the adhesive preferably has a viscosity of less than 10,000 cps at the temperature (for example, 25° C.) during the coating and laminating operations. This liquid adhesive is preferably coated by a spin coating method among various methods described later. As such an adhesive, a UV-curable adhesive and a visible light-curable adhesive are particularly preferred, because the thickness of the adhesive layer can be made uniform and moreover, the processing speed is high for the above-described reason.

The storage modulus of the adhesive is preferably $5 \times 10^8$ Pa or more at 25° C. after curing, because the semiconductor wafer can be free from distortion due to stress imposed during the grinding, enabling uniform grinding to a very small thickness, and furthermore, the semiconductor wafer can be prevented from chipping duo to stress locally imposed at the dicing.

When the photocurable adhesive is cured on the semiconductor wafer, the adhesion area is reduced due to curing shrinkage and the adhesion to the wafer is liable to decrease. In order to ensure sufficiently high adhesion, the photocurable adhesive is preferably an adhesive which can recover the adhesion under heating to a temperature higher than the glass transition temperature (Tg). Such an adhesive has a minimum storage modulus of $3.0 \times 10^7$ to $7.0 \times 10^7$ Pa as measured at a temperature of 25 to 180° C. If the minimum storage modulus is too high, sufficiently high adhesion cannot be obtained and this may give rise to intrusion of water into the interface between the wafer and the adhesive layer, edge chipping of the wafer or damage in the center portion of wafer. On the other hand, if the minimum storage modulus is excessively low, the adhesive layer after the heating step such as lamination step to a die bonding tape can be hardly separated in some cases.

Furthermore, the storage modulus at a maximum achievable temperature on the interface of the wafer and the adhesive layer during grinding (usually from 40 to 70° C., for example, 50° C.) is preferably $9.0 \times 10^7$ (Pa) or more, more preferably $3.0 \times 10^8$ (Pa) or more. With the storage modulus in this range, the pressing in the vertical direction by a grinding blade during grinding is prevented from causing local deformation of the adhesive layer to an extent of damaging the silicon wafer.

The term "storage modulus" or "elastic modulus" as used in the present application means a storage modulus measured by using an adhesive with a sample size of 22.7 mm×10 mm×50 μm in a temperature ramp mode and a tensile mode at a frequency of 1 Hz, a strain of 0.04% and a temperature ramp rate of 5° C./min. This storage modulus can be measured using SOLIDS ANALYZER RSA II (trade name) manufactured by Rheometrics, Inc.

As the photocurable adhesive satisfying all of these conditions, an adhesive where the total amount of bifunctional urethane (meth)acrylate oligomers having a molecular weight of 3,000 or more is 40 wt % or more and the total amount of bifunctional (meth)acryl monomers is 25 wt % or more is known and this is suitably used. However, the adhesive is not particularly limited as long as it exhibits necessary properties (adhesion, functional property).

The thickness of the adhesive layer is not particularly limited as long as the thickness uniformity required for the grinding of semiconductor wafer and the tear strength necessary for the separation by peeling of the adhesive layer from the chip after dicing and removal of support can be ensured and the asperities on the wafer surface can be sufficiently absorbed. The thickness of the adhesive is typically from 10 to 150 μm, preferably from 25 to 100 μm.

In another embodiment, the adhesive layer may include a region of different adhesive properties. This region can involve adjustment to the adhesive formulation (for example, a region with greater or lesser concentration of curative within the adhesive and/or pattern coating of different adhesives) or adjustment of curing levels (for example, using a partially transparent or opaque mask to block some or all photocuring energy in a selected pattern).

One useful example involves an edge region having greater adhesion to the wafer than the adhesion in the center region. In this embodiment, a second adhesive layer may be prepared between said adhesive and said semiconductor wafer at the perimeter portion of a semiconductor wafer. The perimeter portion is a portion where typical defects like edge chip or peeling-off occurs in a grinding process. These defects can be reduced, minimized, or even eliminated, when the semiconductor wafer is supported by greater adhesion in this perimeter portion. Said second adhesive layer has relatively large adhesion as compared with said first adhesive layer (main adhesive layer) and is cured with said first adhesive layer by irradiation and then the two adhesives can be peeled off together.

Applying said second adhesive layer can make adhesion only in a perimeter portion increase, maintaining ease in peeling of the adhesive layer in the central portion (device portion) of the semiconductor wafer. The thickness of said second adhesive layer is not particularly limited. In some embodiments it is preferred to use a thickness for this second adhesive region smaller than the thickness of the whole adhesives lager, such that the combination of the first and second adhesive layer is not greater than the adhesive thickness in other regions. In an embodiment where the storage modulus of said second adhesive layer is less than that of said first adhesive layer, the mechanical properties of the whole adhesive layer are not significantly detrimentally affected by making the thickness of said second adhesive layer very thin. In another embodiment, a concentric ring of a second adhesive can be used in the periphery along with the first adhesive in the center region.

The application of the second adhesive material region can be via any known means. For example, the second adhesive can be dispensed to the desired region (for example, a wafer edge region) using a nozzle and spin-coating, which can be carried out before or after applying the first adhesive or at the same time. By this method, the overall adhesive flatness is maintained.

In one embodiment where the second adhesive has greater adhesion to the wafer surface, the second adhesive may include monomer(s) having polar groups. In one embodiment, the mechanical property (E') of this second adhesive is a little bit lower than that of the first adhesive.

Other Useful Additives

In the production method of a semiconductor chip of the present invention, the wafer circuit may be damaged by radiation energy such as laser light. In order to avoid such a circuit damage, a dye of absorbing light at the wavelength of radiation energy or a pigment of reflecting the light may be contained in any one layer such as adhesive layer or photothermal conversion layer or may be contained in a layer newly provided between the photothermal conversion layer and the wafer. Examples of the dye of absorbing laser include dyes having an absorption peak in the vicinity of the wavelength of laser light used (for example, phthalocyanine-based dyes and cyanine-based dyes). Examples of the pigment of reflecting laser light include inorganic white pigments such as titanium oxide.

Usage of the Present Invention

The semiconductor chip produced by the method of the present invention is effective, for example, in the following uses.

1. Laminated CSP (Chip Size Package) Aiming at High-Density Packaging

This is one of device forms called system-in-package where a plurality of Large-scale integrations (LSI) and passive parts are housed in a single package to realize multifunction or high performance, and is called a stacked multi-chip package. According to the present invention, a wafer of 25 μm or less can be stably produced in a high yield and therefore, the present invention is effective for this usage.

2. Through-Type CSP Requiring High Function and High-Speed Processing

In this device, the chips are connected by a through electrode, whereby the wiring length is shortened and the electrical properties are improved. From the technical problems such as formation of a through hole for forming a through electrode and embedding of copper (Cu) in the through hole, the chip is demanded to be thinner. In the case of sequentially forming chips having such a configuration by using the laminated body of the present invention, an insulating film and an electrode must be formed on the back surface of the chip and the laminated body is demanded to have resistance against heat and chemicals. Even in this case, when the above-described support, photothermal conversion layer and adhesive layer are selected, the present invention can be effectively applied.

3. Ultrathin Compound Semiconductor (e.g., GaAs) Improved in Heat Radiation Efficiency, Electrical Properties and Stability Compound semiconductors such as gallium arsenide are being used for high-performance discrete chip, laser diode and the like because of their more excellent electrical properties (high electron mobility, direct transition-type band structure) than silicon. Their performance is improved by thinning the chip according to the method of the present invention and thereby increasing the heat radiation efficiency. At present, the grinding for thinning and the formation of electrode are performed by joining a semiconductor wafer to a glass substrate as the support using a grease or a resist material. Therefore, the joining material must be dissolved by a solvent or the like for separating the chip from the glass substrate after the completion of processing. This is accompanied with problems that the separation requires a long time of more than several days and the waste solution must be treated. These problems can be solved when the method of the present invention is used.

EXAMPLES

The present invention is described in greater detail below by referring to Examples.

Example 1

A glass substrate of 204 mm (diameter)×1.0 mm (thickness) was used as the light-transmitting support, and a silicon wafer of 200 mm (diameter)×750 μm (thickness) was used as the semiconductor wafer. A 10% solution (in propylene glycol methylether acetate solvent) of a photothermal conversion layer precursor having the composition shown in Table 1 below was coated on the glass substrate by spin coating. This was dried by heating and then cured by 1500 mJ/cm$^2$ of ultraviolet (UV) irradiation to form a photothermal conversion layer on the support. On the other hand, an adhesive layer precursor having the composition shown in Table 2 below was coated on the wafer similarly by spin coating. The glass substrate and the wafer were laminated to each other in a vacuum adhesion apparatus shown in FIG. 2 and thereon, 1500 mJ/cm2 of UV was irradiated to cure the adhesive layer precursor, thereby obtaining a laminated body. This laminated body had a configuration of glass substrate/photothermal conversion layer/adhesive layer/silicon wafer, the thickness of the photothermal conversion layer was 0.9 μm, the thickness of the adhesive layer was 50 μm, and the adhesion area was 314 cm$^2$.

An adhesive with a sample size of 22.7 mm×10 mm×50 μm was separately produced from the above-described adhesive precursor. The storage modulus of this sample was measured by using SOLIDS ANALYZER RSA II (trade name) manufactured by Rheometrics, Inc. in a temperature ramp mode and a tensile mode at a frequency of 1 Hz, a strain of 0.04% and a temperature ramp rate of 5° C./min. The storage modulus at 25° C. was 8.8×10$^8$ Pa.

TABLE 1

Adhesive Layer 1

| Chemical Name | Trade Name | Weight Percentage |
|---|---|---|
| Urethane acrylate | UV7000B | 28.6% |
| Urethane acrylate | UV6100B | 28.6% |
| 1,6-Hexanediol diacrylate | 1,6-HX-A | 38.1% |
| Photoreaction initiator | Irgacure 369 | 4.8% |
| Total | | 100.0% |

UV-7000B (The Nippon Synthetic Chemical Industry Co., Ltd.)
UV-6100B (The Nippon Synthetic Chemical Industry Co., Ltd.)
1,6-HX-A (Kyoeisha Chemical Co., Ltd.)
Irgacure 369 (Ciba Specialty Chemicals K.K.)

TABLE 2

Photothermal Conversion Layer 1

| Chemical Name | Trade Name | Weight Percentage |
|---|---|---|
| Carbon black | Sevacarb | 25.0% |
| Silica | Aerosil A200 | 32.5% |
| Dispersant | Disperbyk 161 | 7.5% |
| Acryl resin | Joncryl 690 | 35.0% |
| Total | | 100.0% |

Sevacarb (Columbian Carbon Japan Ltd.)
Aerosil A200 (Nippon Aerosil Co.)
Joncryl 690 (Johnson Polymer Co.)
Disperbyk 161 (BYK Chemie Japan Co., Ltd.)

The laminated body obtained was set in a grinding apparatus shown in FIG. 3 and ground by contacting therewith the grinding wheel under rotation while supplying water flow to the laminated body. The grinding was continued by the grinding apparatus until the wafer thickness became 25 μm. Subsequently, the damage layer (about 2 μm) was removed by a dry polishing apparatus. The grinding apparatus used was DFG850 (trade name) manufactured by DISCO and the grinding was performed uniaxially with a grinding wheel having a grain size of #360 at a rotation number of 4,800 rpm and then performed with a grinding wheel having a grain size of #2000 at 5,500 rpm.

After the grinding, the semiconductor wafer was diced by a dicing apparatus. The dicing apparatus used was DFD641 (trade name) manufactured by DISCO and the dicing was performed with a grinding wheel having a grain size of #3500 at a rotation number of 30,000 rpm and a feed speed of 40 mm/sec. The dicing was performed at intervals of 1 cm. Thereafter, on the laminated body having a plurality of semiconductor chips after dicing, a pressure-sensitive adhesive sheet fixed in a ring-like metal frame was disposed in the side having chips and then, laser light was irradiated from the glass substrate side.

The laser irradiation was performed by a YAG laser (wavelength: 1.064 nm) at a laser output of 7.0 W, a beam size and scanning pitch of 130 μm and a laser scanning speed of 1.5 m/sec. The laser light was irradiated over the entire surface of the laminated body while linearly reciprocating the laser light from the edge part toward the tangential direction of the laminated body. After this laser irradiation, a suction cup was attached to the glass substrate of the laminated body and then pulled up, whereby the glass plate was easily separated from the chip and a chip having an adhesive layer was obtained.

For separating the adhesive layer from the chip, a pressure-sensitive adhesive tape (Scotch Pressure-Sensitive Adhesive Tape #3305 produced by 3M) was attached to the adhesive layer surface and peeled to the direction of 180°, as a result, a chip could be obtained without causing any damage. The size of chipping (edge chipping) of the obtained chip was observed through an optical microscope. The results are shown in Table 5.

Example 2

A test was performed in the same manner as in Example 1 except that the composition of adhesive was changed as shown in Table 3 below and after curing the adhesive layer, the laminated body was placed in an oven at 120° C. for 3 minutes. The storage modulus at 25° C. of the adhesive layer after curing was $1.5 \times 10^8$ Pa. The chip could be obtained without causing any damage. The size of chipping (edge chipping) of the obtained chip was observed through an optical microscope. The results are shown in Table 5.

TABLE 3

| Adhesive Layer 2 | | |
|---|---|---|
| Chemical Name | Trade Name | Weight Percentage |
| Urethane acrylate | UV7000B | 47.6% |
| Dicyclopentanyl acrylate | FA513A | 19.0% |
| 1,6-Hexanediol diacrylate | 1,6-HX-A | 28.6% |
| Photoreaction initiator | Irgacure 369 | 4.8% |
| Total | | 100.0% |

UV-7000B (The Nippon Synthetic Chemical Industry Co., Ltd.)
FA513A (Hitachi Chemical Co., Ltd.)
1,6-HX-A (Kyoeisha Chemical Co., Ltd.)
Irgacure 369 (Ciba Specialty Chemicals K.K.)

Example 3

A test was performed in the same manner as in Example 1 except that the composition of adhesive was changed as shown in Table 4 below. The storage modulus at 25° C. of the adhesive layer after curing was $5.0 \times 10^8$ Pa. The chip could be obtained without causing any damage. The size of chipping (edge chipping) of the obtained chip was observed through an optical microscope. The results are shown in Table 5.

TABLE 4

| Adhesive Layer 3 | | |
|---|---|---|
| Chemical Name | Trade Name | Weight Percentage |
| Urethane acrylate | UV6100B | 57.1% |
| 1,6-Hexanediol diacrylate | 1,6-HX-A | 38.1% |
| Photoreaction initiator | Irgacure 369 | 4.8% |
| Total | | 100.0% |

UV-6100B (The Nippon Synthetic Chemical Industry Co., Ltd.)
1,6-HX-A (Kyoeisha Chemical Co., Ltd.)
Irgacure 369 (Ciba Specialty Chemicals K.K.)

Comparative Example 1

A test was performed in the same manner as in Example 1 except that the pressure-sensitive adhesive sheet fixed in a ring-like metal frame was attached to the laminated body without performing dicing after grinding. The glass substrate was removed by laser irradiation and then the adhesive was removed by peeling. A thinned wafer could be obtained without causing any damage. Thereafter, the silicon wafer fixed to the pressure-sensitive adhesive tape in a ring-like metal frame was diced by a dicing apparatus under the same conditions as in Example 1. The size of chipping (edge chipping) of the obtained chip was observed through an optical microscope. The results are shown in Table 5.

TABLE 5

| | Size of the largest Edge Chipping in dicing [μm] | |
|---|---|---|
| | Edge Part in Dicing Saw Side | Edge Part in Pedestal Side |
| Example 1 | 2.5 | 2.5 |
| Example 2 | 2.0 | 2.5 |
| Example 3 | 2.0 | 4.0 |
| Comparative Example 1 | 3.0 | 12.5 |

In Example 1, 2 and 3, the size of Edge chipping was 4 μm or less. On the other hand, In Comparative Example 1, which is a conventional method, the size of Edge chipping was 12.5 μm which was not acceptable in some current productions. In general, chips on a wafer are divided by 40-50 μm wide streets (scribe lines). Even if the thinnest dicing saw is used, its cutting width will become 30 μm and only 5-10 μm of margin on each bank will remain. Therefore the size of Edge chipping should be controlled less than 10 μm or less than 5 μm in some cases, or even less than 3 μm in other cases.

Example 4

A laminated body was formed in the same manner as in Example 1 except that the composition of the photothermal layer was changed as shown in Table 6. This laminated body was fixed on an optical microscope by laying the glass substrate side up and the reflected light was observed by CCD. As a result, scribed lines on the wafer could be clearly recognized. From this, it was verified that the alignment for dicing of the laminated body can be easily performed.

TABLE 6

Photothermal Conversion Layer 2

| Chemical Name | Trade Name | Weight Percentage |
|---|---|---|
| Carbon black | Sevacarb | 12.0% |
| Silica | Aerosil A200 | 40.0% |
| Dye | Epolite 1117 | 6.5% |
| Dispersant | Disperbyk 161 | 30.4% |
| Acryl resin | Joncryl 690 | 10.6% |
| Total | | 100.0% |

Sevacarb (Columbian Carbon Japan Ltd.)
Aerosil 200 (Nippon Aerosil Co.)
Epolite 1117 (Sun Chemical Company Ltd.)
Disperbyk 161 (BYK Chemie Japan Co., Ltd.)
Joncryl 690 (Johnson Polymer Co.)

The invention claimed is:

1. A method for producing a semiconductor chip, comprising:
    applying a photothermal conversion layer comprising a light-absorbing agent and a heat decomposable resin on a light-transmitting support, provided that upon irradiation of radiation energy, said photothermal conversion layer converts the radiation into heat and decomposes due to the heat,
    preparing a semiconductor wafer having a circuit face with a circuit pattern and a non-circuit face on the side opposite said circuit face, laminating said semiconductor wafer and said light-transmitting support through a photocurable adhesive by placing said circuit face and said photothermal conversion layer to face each other, and irradiating light from said light-transmitting support side to cure the photocurable adhesive layer, thereby forming a laminated body having a non-circuit face on the outside surface,
    grinding the non-circuit face of said semiconductor wafer until said semiconductor wafer reaches a desired thickness,
    dicing the ground semiconductor wafer from the non-circuit face side to cut it into a plurality of semiconductor chips,
    irradiating radiation energy from said light-transmitting support side to decompose said photothermal conversion layer, thereby causing separation into semiconductor chips having said adhesive layer and a light-transmitting support, and optionally
    removing said adhesive layer from said semiconductor chips.

2. The method for producing a semiconductor chip of claim 1, wherein a die bonding tape is affixed to the semiconductor wafer before dicing the ground semiconductor wafer.

3. The method for producing a semiconductor chip of claim 1, wherein said photothermal conversion layer contains carbon black, and/or a transparent filler.

4. The method for producing a semiconductor chip of claim 2, wherein said photothermal conversion layer contains carbon black, and/or a transparent filler.

5. The method for producing a semiconductor chip of claim 1, wherein laminating said semiconductor wafer and said light-transmitting support through a photocurable adhesive is performed in a vacuum.

6. The method for producing a semiconductor chip of claim 1, wherein said semiconductor wafer is ground to a thickness of 50 μm or less.

7. The method for producing a semiconductor chip of claim 1, wherein said photocurable adhesive layer has a storage modulus of $5\times10^8$ Pa or more after curing.

8. The method of claim 1, wherein dicing is performed while recognizing scribe lines, and with alignment via light capable of passing through a) the light-transmitting support and photothermal conversion layer from said light-transmitting support side or b) the semiconductor wafer from the non-circuit side.

9. The method for producing a semiconductor chip claim 3, wherein laminating said semiconductor wafer and said light-transmitting support through a photocurable adhesive is performed in a vacuum.

10. The method for producing a semiconductor chip claim 4, wherein laminating said semiconductor wafer and said light-transmitting support through a photocurable adhesive is performed in a vacuum.

11. The method for producing a semiconductor chip of claim 3, wherein said semiconductor wafer is ground to a thickness of 50 μm or less.

12. The method for producing a semiconductor chip of claim 4, wherein said semiconductor wafer is ground to a thickness of 50 μm or less.

13. The method for producing a semiconductor chip of claim 3, wherein said photocurable adhesive layer has a storage modulus of $5\times10^8$ Pa or more after curing.

14. The method for producing a semiconductor chip of claim 4, wherein said photocurable adhesive layer has a storage modulus of $5\times10^8$ Pa or more after curing.

15. The method of claim 2, wherein dicing is performed while recognizing scribe lines, and with alignment via light capable of passing through a) the light-transmitting support and photothermal conversion layer from said light-transmitting support side or b) the semiconductor wafer from the non-circuit side.

16. The method of claim 3, wherein dicing is performed while recognizing scribe lines, and with alignment via light capable of passing through a) the light-transmitting support and photothermal conversion layer from said light-transmitting support side or b) the semiconductor wafer from the non-circuit side.

17. The method of claim 4, wherein dicing is performed while recognizing scribe lines, and with alignment via light capable of passing through a) the light-transmitting support and photothermal conversion layer from said light-transmitting support side or b) the semiconductor wafer from the non-circuit side.

18. The method for producing a semiconductor chip of claim 1, wherein a die bonding tape is affixed to the semiconductor wafer before dicing the ground semiconductor wafer, wherein said semiconductor wafer is ground to a thickness of 50 μm or less.

19. The method for producing a semiconductor chip of claim 1, wherein a die bonding tape is affixed to the semiconductor wafer before dicing the ground semiconductor wafer, wherein said semiconductor wafer is ground to a thickness of 50 μm or less, and wherein said photocurable adhesive layer has a storage modulus of $5\times10^8$ Pa or more after curing.

20. The method for producing a semiconductor chip of claim 1, wherein a die bonding tape is affixed to the semiconductor wafer before dicing the ground semiconductor wafer, wherein said semiconductor wafer is ground to a thickness of 50 μm or less, and wherein dicing is performed while recognizing scribe lines along with alignment via light capable of passing through a) the light-transmitting support and photothermal conversion layer from said light-transmitting support side or b) the semiconductor wafer from the non-circuit side.

* * * * *